United States Patent [19]

Mito

[11] Patent Number: 4,947,458
[45] Date of Patent: Aug. 7, 1990

[54] OPTICAL TRANSMITTER UTILIZING A BISTABLE DISTRIBUTED FEEDBACK SEMICONDUCTOR LASER

[75] Inventor: Ikuo Mito, Tokyo, Japan
[73] Assignee: NEC Corporation, Tokyo, Japan
[21] Appl. No.: 760,560
[22] Filed: Jul. 30, 1985

[30] Foreign Application Priority Data

Jul. 30, 1984 [JP] Japan ................................ 59-159823

[51] Int. Cl.$^5$ .............................................. H04B 9/00
[52] U.S. Cl. ........................................ 455/609; 372/96; 455/611; 455/613; 455/618
[58] Field of Search ............... 455/609, 611, 613, 618; 372/26, 29, 38, 96

[56] References Cited

U.S. PATENT DOCUMENTS

| | | | |
|---|---|---|---|
| 3,680,001 | 7/1972 | Paoli et al. | 455/611 |
| 4,558,465 | 12/1985 | Siegel et al. | 372/38 |
| 4,603,420 | 7/1986 | Nishizawa | 372/50 |
| 4,608,682 | 8/1986 | Nagashima | 455/600 |
| 4,611,352 | 9/1986 | Fujito et al. | 455/613 |
| 4,612,671 | 9/1986 | Giles | 455/613 |
| 4,658,402 | 4/1987 | Kabayashi | 372/96 |
| 4,665,527 | 5/1987 | Akiba et al. | 372/46 |
| 4,674,100 | 6/1987 | Kobayashi | 372/50 |

FOREIGN PATENT DOCUMENTS 59-117285  7/1984  Japan ...................................... 372/38

OTHER PUBLICATIONS

Shigeyuki Akiba et al., "Distributed Feedback InGaAsP/InP Lasers With Window Region Emitting at 1.5/um Range", Ieee Journal of Quantum Electronics, vol. OE-19, No. 6, Jun. 1983, pp. 1052-1056.
Yamaguchi et al., "Paper 1026", 1984 National Convention (Record) of the Institute of Electronics and Communication Engineers of Japan, pp. 4-80.

*Primary Examiner*—Benedict V. Safourek
*Assistant Examiner*—L. Van Beek
*Attorney, Agent, or Firm*—Foley & Lardner, Schwartz, Jeffery, Schwaab, Mack, Blumenthal & Evans

[57] ABSTRACT

A bistable distributed feedback laser device is employed for transmitting optical signals. A bias current which is less than the threshold lasing turnoff current is supplied to the laser. A drive circuit provides a pulse current which, when added to the bias current, exceeds the threshold lasing turnon current. In this manner, the device is modulated so as to traverse the hysteresis region, hereby preventing undesirable expansion of the spectrum line width.

8 Claims, 2 Drawing Sheets

OPTICAL TRANSMITTER UTILIZING A BISTABLE DISTRIBUTED FEEDBACK SEMICONDUCTOR LASER

BACKGROUND OF THE INVENTION

The present invention relates to an optical transmitter for optical fiber communications.

With the advent of low-loss optical fibers, singlemode semiconductor lasers, such as distributed feedback semiconductor lasers (hereinafter referred to as DFB LDs for brevity), high sensitivity light receiving elements, such as germanium or InGaAs avalanche photodiodes (hereinafter referred to as APDs for brevity), and the like, optical fiber communications over a distance of more than 100 km has recently been brought to a practicable stage. Studies are presently under way for further increasing the transmission range and the transmission rate.

One of major obstructions to longer range and higher rate lightwave communications is the wavelength dispersion of optical fibers. Specifically, while in the wavelength range of 1.5–1.6 μm, the transmission loss of optical fibers is minimal and long-distance transmission is practicable. The wavelength dispersion due mainly to material dispersion amounts to about −2 ps/km/Å in that specific wavelength range. Hence, in order that transmission may be effected over a distance of the order of 100 km with a modulation rate of 2 Gb/s, a light source which is naturally operable in a single longitudinal mode is essential and, yet, the spread of its spectrum width has to be restricted to about 0.8 Å. However, where a prior art DFB LD is directly modulated at a high rate, the carrier density of an active layer in the DFB LD is modulated and, therefore, the lasing wavelength is necessarily modulated ("wavelength chirping" as generally referred to). This causes an undesirable expansion of the spectrum line width of about 1–2 Å. As such, where high-speed transmission is desired in the wavelength band of 1.5 μm, the transmissible distance is limited by wavelength dispersion rather than by transmission loss.

SUMMARY OF THE INVENTION

It is therefore an object of the present invention to provide an optical transmitter for optical fiber communications which allows a minimum of wavelength chirping to occur, even during high-speed direct modulation.

In accordance with the present invention, there is provided an optical transmitter including at least a bistable distributed feedback semiconductor laser having hysteresis which includes a first lasing threshold value indicating a point where an injection current is increased and a second lasing threshold value indicating a point where the injection current is decreased, a bias circuit for applying a bias current lower than the second lasing threshold value to the semiconductor laser, and a drive circuit for applying to the semiconductor laser a current pulse having a peak which is higher than the first lasing threshold value when the current pulse is superposed on the bias current.

BRIEF DESCRIPTION OF THE PRINCIPLE

Before entering into a detailed description of the present invention, the characteristics of a bistable DFB LD which constitutes an essential element of the present invention will be outlined. Even with a DFB LD, a bistable mode operation is attainable by defining a non-injection region where no current is injected, as taught by Akiba et al in IEEE Journal of Quantum Electronics. Vol. QE-19, No. 6, page 1053, issued 1983. A bistable DFB LD shown in FIGS. 2A and 2B of the drawings was manufactured for test by providing a non-injection region 100 in a part of a double-channel planar buried DFB LD which had been reported by Yamaguchi et al at the 1984 National Convention (Record) of the Institute of Electronics and Communication Engineers of Japan, Paper No. 1026.

Figure 3A:
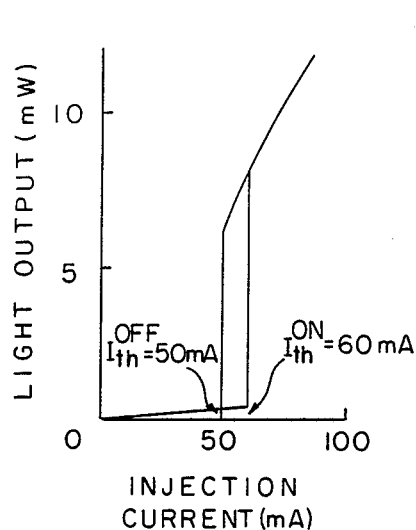
FIG. 3A is a plot showing an L-I characteristic of a bistable DFB LD.

As shown in FIG. 3A, the light output of the above-mentioned type of DFB LD shows a hysteresis characteristic responsive to injection current; the lasing threshold current $I_{ON,th}$ at the rise time measured 60 mA and the lasing threshold current $I_{OFF,th}$ at the fall time measured 50 mA. The previously mentioned paper presented by Akiba et al teaches such a hysteresis characteristic but not a lasing spectrum and the like. By measuring a lasing spectrum in relation to injection current, it was proved that a single mode operation with a lasing wavelength of 1,550 μm occurs in an injection current range of the order of 50-100 mA. However, more precise measurement of the lasing wavelength showed that the frequency slightly shifts depending upon the injection current, as plotted in FIG. 3B. Even in an ordinary DFB LD, the lasing frequency shifts in response to an increase of injection current due to the influence of a change in the carrier density of the active layer, as well as an increase in the temperature of the same layer, but a bistable DFB LD exhibited behavior different from that of the ordinary DFB LD. Specifically, the bistable DFBLD was found to have a peak at a current which is slightly above $I_{ON,th}$. Little change in the lasing frequency was observed, despite current changes in the vicinity of $I_{ON,th}$. The shift of of $I_{OFF,th}$ is 0.6–0.8 GHz/mA which is greater than the ordinary DFB LD which lacks a non-injection region.

Figure 3B:
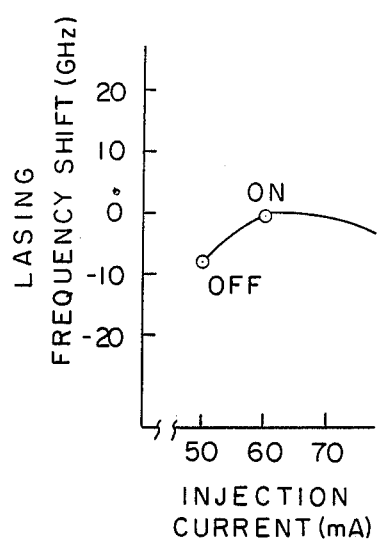
FIG. 3B is a plot showing shifts of lasing frequency.
Figure 4A:
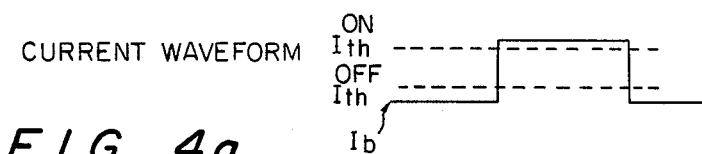
FIG. 4A is a chart showing a current waveform and a modulated waveform of light output.
Figure 4B:
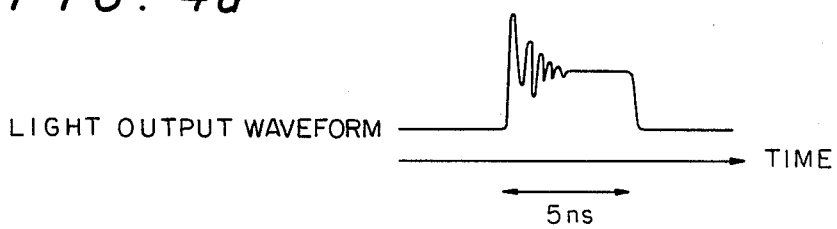
FIG. 4B is a chart showing shifts of lasing frequency during modulation.
Figure 4B:
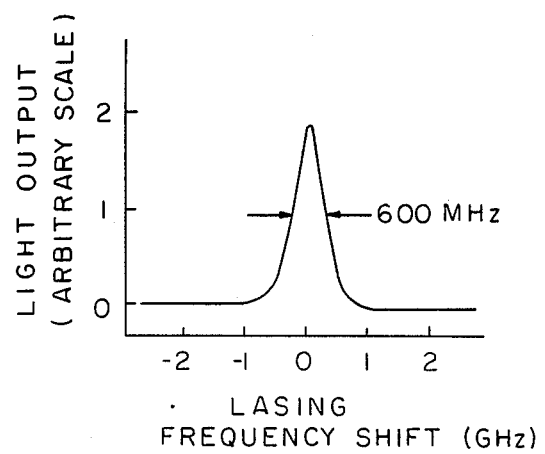

A rectangular pulse current was applied to a bistable DFB LD having the above-described characteristic to evaluate its response. Specifically, as shown in FIG. 4A, a dc bias current $I_b$ was set at 48 mA which was lower than $I_{OFF,th}$ and pulses having a peak value of 15 mA and a width of 5 ns were applied to the DFB LD. The resulting light output showed significant relaxation oscillation in its waveform at the rise time. Generally, a semiconductor laser under such significant relaxation oscillation shows a significant change in lasing frequency because the carrier density of its active layer is greatly modulated. However, it was found that the tested bistable DFB LD has a lasing spectrum line width of about 600 MHz in terms of half width as shown in FIG. 4B and, thus, the amount of fluctuation of lasing frequency is small. The reason is that, as shown in FIG. 3B, when the DFB LD is caused to lase by increased injection current the fluctuation of the oscillation frequency remains insignificant at those current values with no regard to the fluctuation of the carrier density of the active layer and, hence, the lasing frequency shows little fluctuation despite substantial fluctuation of light output, i.e. substantial intensity modulation of light.

The phenomenon stated above is the first revelation in conjunction with a bistable DFB LD. Such a characteristic of a bistable DFB LD is applicable to optical fiber communications.

DETAILED DESCRIPTION OF THE PREFERRED EMBODIMENT

Figure 1:
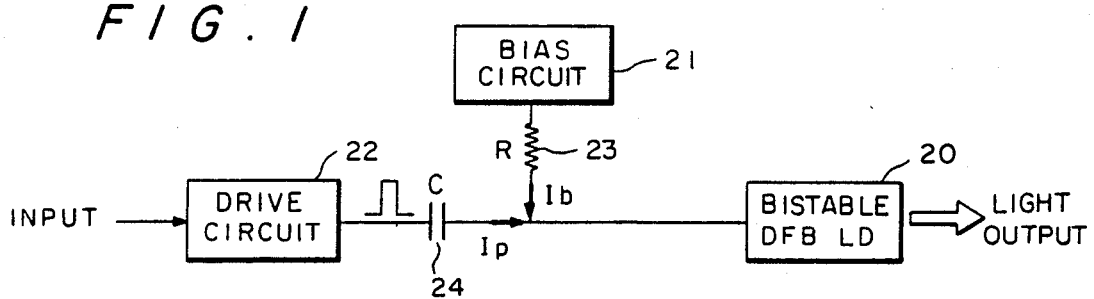
FIG. 1 is a block diagram of an optical transmitter embodying the present invention which partly shows specific circuit elements.

Referring to FIG. 1 of the drawings, an optical transmitter embodying the present invention is shown in a block diagram. The optical transmitter comprises a bias circuit 21 and a drive circuit 22 which in cooperation serve to activate a bistable DFB LD 20, and a coupling resistor 23 and a coupling capacitor 24. As shown in detail in FIGS. 2A and 2B, the bistable DFB LD has a mesa stripe which includes an active layer 3, a waveguide layer 4 conjugate with the active layer 3 and provided with corrugation having a predetermined period, and a cladding layer 5 which holds the waveguide layer 4 between it and the active layer 3. In addition to the layers 3, 4 and 5, the DFB LD includes an n-InP confining layer 7 provided on an intermediate portion of the mesa stripe, and a P-InP burying layer 8 and a cap layer 9. A voltage is applied across a positive electrode 10 and a negative electrode 11 to inject current into the active layer 3. The particular part of the active layer 3 located below the confining layer 7 defines a non-injection region where current injection does not occur, so that the light output shows a bistable characteristic. The procedure for manufacturing the DFB LD 20 will be described later in detail.

To evaluate the characteristics of the light transmitter shown in FIG. 1, a bias current $I_b$ of 48 mA which is lower than the threshold current $I_{OFF,th}=50$ mA for the biastable DFB LD to turn off was applied to the DFB LD 20. A pulse current $I_p$ was applied to the DFB LD 20 from the drive circuit 22. The pulse current had a peak value of 15 mA, which is higher than the threshold current, $I_{ON,th}=60$ mA for the DFB LD 20 to turn on, when superposed on the bias current $I_b$ responsive to an input signal. The coupling resistor 23 had a resistance value of 50 Ω and the coupling capacitor 24 a capacitance of 1 μF in order to suppress leakage of electricity between the bias circuit 21 and the drive circuit 22. An output signal of a 450 MHz pseudo-random pulse generator was used as an input signal for operating the light transmitter. The evaluation showed that the bistable DFB LD 20 generates optical signal pulses which follow the input signal, and that the optical pulses are each 7 mW high. The spectrum of the modulated light signal was found by evaluation to be similar to the spectrum shown in FIG. 4B and, in addition, optical signals modulated by random pulses also had a lasing spectrum line width as narrow as about 600 MHz.

Transmission tests were conducted by introducing optical signals provided by the optical transmitter of the present invention into single mode fibers having a core diameter of 10 μm through an optical lens arrangement and with a coupling loss of 2 dB. A receiver used for the tests was implemented with a Ge-APD having a light receiving diameter of 80 μm. The received power level of the receiver was −42 dBm for a bit error rate of $10^{-10}$ S$^{-1}$. When optical fibers which show an average transmission loss of 0.25 dB/km (inclusive of splice losses of the optical fibers at the wavelength in the 1.55μm band) were used, the transmitter successfully transmitted signals over a distance of 160 km with a margin of 2 dBm. It was found that this distance is the result of limitation due to losses and not to the dispersion of the optical fibers, and that the lasing spectrum line width of signal light is restricted to a sufficiently small value. This shows the effectiveness of modulating the bistable DFB LD 20 in such a manner as to traverse the hysteresis region. In this connection, when the bias current $I_b$ was increased so as to modulate the bistable DFB LD 20 in such a manner as not to traverse the hysteresis region, that is, when the bias current $I_b$ was controlled to a value between $I_{ON,th}$ and $I_{OFF,th}$ and the pulse current was superposed on such a bias current $I_b$ for modulation, the spectrum line width measured about 3 GHz with the result that the transmittable range was limited to 100 km due to the influence of wavelength dispersion.

Figure 2A:
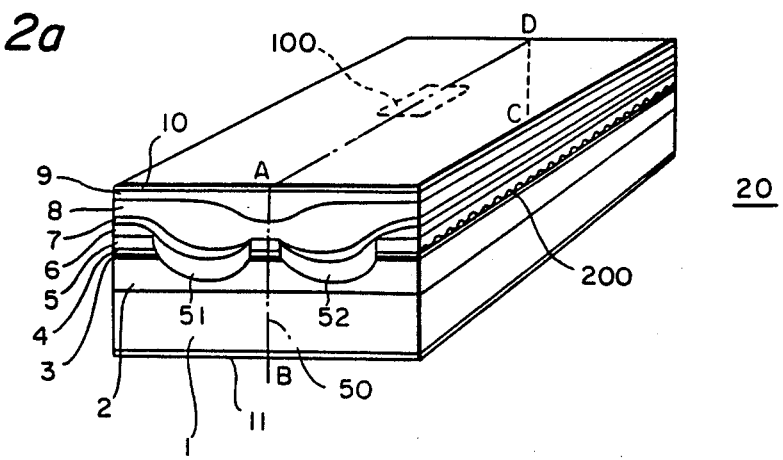
FIG. 2A is a perspective view of a bistable DFB LD applicable to the embodiment of the present invention.
Figure 2B:
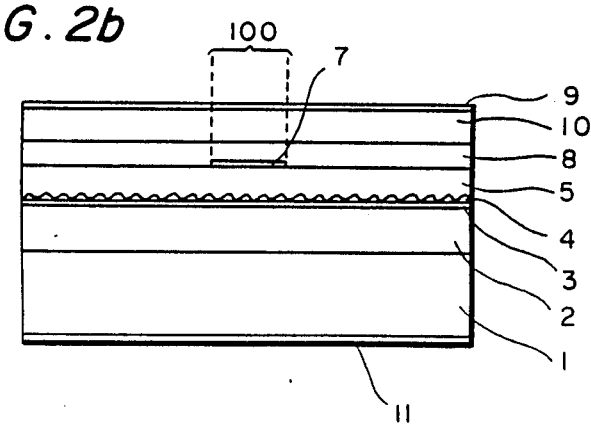
FIG. 2B is a section along line BADC of FIG. 2A.

Now, a reference will be made to FIGS. 2A and 2B for explaining the method of manufacturing the DFB LD 20. The DFB LD 20 comprises an (001) n-InP substrate 1 on which an n-InP buffer layer 2 (Sn-doped, carrier density of $5\times10^{17}$ cm$^{-3}$, thickness of 3 μm), a non-doped InGaAsP active layer 3 (1.3 μm composition in terms of emission wavelength, thickness of 0.1 μm), and a p-InGaAsP guide layer 4 (1.1 μm composition in terms of emission wavelength, Zn-doped, carrier density of $7\times10^{18}$ cm$^{-3}$, thickness of 0.2 μm) are sequentially grown. The p-InGaAsP guide layer 4 is provided with a diffraction grating 200 having a period of 2000 Å and a depth of 1000 Å. A p-InP cladding layer 5 (Zn-doped, carrier density of $1\times10^{18}$ cm$^{-3}$, and thickness of 1 μm) is deposited on the surface of the wafer which has been provided with the diffraction grating 200. After two parallel channels or grooves 51 and 52 have been provided at both sides of a mesa stripe 50 which is 1-2 μm thick, a p-InP blocking layer 6 (Zn-doped, carrier density of $1\times10^{18}$ cm$^{-3}$, 0.5 μm thick in flat portion), an n-InP confining layer 7 (Te-doped, carrier density of $3\times10^{18}$ cm$^{-3}$, 0.5 μm thick in flat portion), a p-InP burying layer 8 (Zn-doped, carrier density of $1\times10^{18}$ cm$^{-3}$, 1.5 μm thick in flat portion), and a p-InGaAsP cap layer 9 (1.2 μm thick composition in terms of emission wavelength, Z-doped, carrier density of $1\times10^{19}$ cm$^{-3}$, about 1 μm thick in a flat portion), are sequentially grown thereby completing a double-channel planar buried structure. Some of the layers mentioned have already been outlined in relation to the specific construction of the transmitter of the present invention. The n-InP confining layer 7 is laminated exclusively on that part of the mesa stripe 50 which lies in the non-injection region 100. To grow the confining layer 7 only in the limited region 100, the two channels 51 and 52 may each be narrowed in the specific region 100. In the non-injection region 100, the confining layer 7 serves to prevent a current from being injected into the InGaAsP active layer 3 which is located beneath the confining layer 7.

While only basic structural elements are shown in the embodiment of FIG. 1, it will be noted that a temperature control unit for controlling the operation temperature of the bistable DFB LD to a predetermined value, a light isolator for reducing the influence of light returning to the DFB LD, and other modifications may be incorporated, if desired. It should be born in mind that the bistable DFB LD structure and current values shown and described are merely typical examples and not restrictive in any way, that is, the present invention is applicable to any kind of DFB LD.

In summary, it will be seen that the present invention provides an optical transmitter which offers a remarkable improvement in transmittable distance over prior art transmitters. This advantage is derived from the fact that since the transmitter of the present invention is capable of generating signal pulses having a narrow lasing spectrum line width, it is free from the limitation due to wavelength dispersion of optical fibers when applied to an optical fiber communications system.

What is claimed is:

1. An optical transmitter comprising:
   a bistable distributed feedback semiconductor laser means for initiating lasing when an injection current reaches a first lasing threshold value and for terminating lasing when said injection current is decreased to a second lasing threshold value, said semiconductor laser means having a hysteresis characteristic such that said second lasing threshold value is smaller than said first lasing threshold value, said semiconductor laser means operating in a single longitudinal mode;
   biasing means for applying a biasing current less than said second lasing threshold value to said semiconductor laser means; and
   driving means for applying a current pulse to said semiconductor laser means, said current pulse having a peak value, wherein the superposition of said peak value and said biasing current is greater than said first lasing threshold value, said biasing current and said current pulse flowing through the same area of an active layer of said bistable distributed feedback semiconductor laser means for causing radiation of said bistable distributed feedback semiconductor laser means.

2. The optical transmitter of claim 1, further comprising a means for suppressing current leakage between said biasing means and said driving means.

3. The optical transmitter of claim 1, wherein said bistable distributed feedback semiconductor laser means further comprises:
   (a) a substrate of a first conductivity type;
   (b) a buffer layer of said first conductivity type;
   (c) an active layer;
   (d) a waveguide layer of a second conductivity type;
   (e) a cladding layer of said second conductivity type;
   (f) a blocking layer of said second conductivity type;
   (g) a confining layer of said first conductivity type;
   (h) a burying layer of said second conductivity type;
   (i) a cap layer of said second conductivity type;
   (j) a positive electrode; and
   (k) a negative electrode;
wherein said layers are disposed one on top of another, and one of said electrodes is disposed below a lowermost layer and the other of said electrodes is disposed above an uppermost layer.

4. The optical transmitter of claim 3, wherein said wave guide comprises a diffraction grating.

5. The optical transmitter of claim 3, wherein said confining layer comprises a means for preventing current from entering into said active layer.

6. The optical transmitter of claim 3, wherein said active layer, said waveguide layer and said cladding layer collectively form a mesa stripe and wherein two substantially parallel channels are provided at each side of said mesa stripe.

7. The optical transmitter of claim 3, wherein said bistable distributed feedback semiconductor layer comprises a non-injection region comprising a portion of said active layer located below said confining layer, and wherein said confining layer is grown only in said non-injection region.

8. A method of transmitting optical signals, comprising the steps of:
   modulating a bistable distributed feedback semiconductor laser device so as to traverse a hysteresis region of said laser device; wherein said modulating further includes,
   (a) applying a bias current to said laser device, said bias current being lower than a lasing threshold OFF current of said laser device; and
   (b) applying a current pulse having a peak value to said laser device, wherein a sum of said peak value and said bias current exceed an ON lasing threshold value of said laser device.

* * * * *